United States Patent [19]
Arienzo et al.

[11] Patent Number: 5,395,769
[45] Date of Patent: Mar. 7, 1995

[54] METHOD FOR CONTROLLING SILICON ETCH DEPTH

[75] Inventors: Maurizio Arienzo, Chappaqua; David L. Harame, Mohegan Lake; Gottlieb S. Oehrlein, Yorktown Heights, all of N.Y.

[73] Assignee: International Business Machines Corporation, Armonk, N.Y.

[21] Appl. No.: 904,729

[22] Filed: Jun. 26, 1992

[51] Int. Cl.$^6$ ............................................. H01L 21/302
[52] U.S. Cl. .......................................... 437/7; 156/626
[58] Field of Search ............................ 156/626; 437/7

[56] References Cited

U.S. PATENT DOCUMENTS

| | | | |
|---|---|---|---|
| 4,177,094 | 12/1979 | Kroon | 156/626 |
| 4,332,833 | 6/1982 | Aspnes et al. | 437/7 |
| 4,367,044 | 1/1983 | Booth, Jr. et al. | 156/626 |
| 4,459,001 | 6/1984 | Sternheim et al. | 156/626 |
| 4,771,013 | 9/1988 | Curran | |
| 4,839,311 | 6/1989 | Riley et al. | 437/7 |
| 4,910,583 | 3/1990 | Behr et al. | |
| 4,927,485 | 5/1990 | Cheng et al. | 156/626 |
| 4,959,328 | 9/1990 | Behr et al. | |
| 5,186,786 | 2/1993 | Galvier et al. | 156/626 |
| 5,190,614 | 3/1993 | Leach et al. | 156/626 |
| 5,220,405 | 6/1993 | Barbee et al. | 156/626 |
| 5,229,303 | 7/1993 | Donnely, Jr. et al. | 437/7 |
| 5,294,289 | 3/1994 | Heinz et al. | 156/626 |

FOREIGN PATENT DOCUMENTS

9120093 12/1991 WIPO .

OTHER PUBLICATIONS

Gambino, R. et al., "Microcircuit ... Diffraction", IBM Tech. Disc. Bull. vol. 20, No. 6 pp. 781-783, Jun. 1977.
K. J. Archer, "Determination of the Properties of Films on Silicon by the Method of Ellipsometry", J. of the Optical Soc. of America, vol. 52, No. 9, Sep. 1962, pp. 970-977.
S. H. Dhong et al., "Etch Rate Monitor", IBM Tech. Discl. Bull. vo. 29, No. 5, Oct. 1986 p. 2204.
J. E. Cronin et al., "Process Resulting in Increased Contact Area Refractory Metal Stud to Aluminum

(List continued on next page.)

Primary Examiner—George Fourson
Attorney, Agent, or Firm—Blaney Harper; Ronald L. Drumheller

[57] ABSTRACT

The present invention is a structure and method for controlling the depth of an etching process. In particular, the method and structure of the present invention creates a marker layer which resides between a layer to be etched and a protected layer. The marker layer is detected during the etch process and the etch process is controlled based on the detection of the marker layer. The marker layer has physical characteristics which are very similar to the layers being etched or protected. The marker layer has a similar lattice constant and electrical behavior to either the etched layer or the protected layer. The marker layer has very different optical properties from the etched or protected layers so that even a thin marker layer can be easily detected using in-situ ellipsometric measurements. A specific embodiment of the present invention is a layer of SiGe interposed between a thick silicon layer and a thin silicon layer. In particular, the SiGe layer has a composition of approximately 10% of germanium and has a thickness of approximately 10Å. The thick silicon layer has a thickness of approximately 5,000Å and the thin silicon layer has a thickness of approximately 1,000Å. A method of etching the thick silicon layer, incorporating one embodiment of the present invention, is to perform a RIE process on the thick silicon layer while monitoring the RIE process with an ellipsometer. When the RIE process encounters the underlying marker layer, the ellipsometer measurements show a marked change. The marked change in the ellipsometer measurements indicate when to stop the RIE process. When the marker layer is very thin, such as 10Å, the RIE process is stopped immediately and the underlying thin silicon layer is not etched into. Even though the RIE process is not uniform, and parts of the marker layer will remain on the surface of the protected layer, this will not affect the electrical behavior of the resulting semiconductor device using this process. This is because the thin SiGe marker layer has electrical characteristics which are very similar to the underlying silicon layer.

18 Claims, 7 Drawing Sheets

OTHER PUBLICATIONS

Wiring", IBM Tech. Discl. Bull., vol. 29, No. 5, Oct., 1986 p. 2207-2208.

S. H. Dhong et al., "Etching End-Point-Detection Technique", IBM Tech. Discl. Bull., vol. 29, No. 2, Jul., 1986 pp. 759-760.

M. Heiblum et al., "Non-Alloyed Submicron Resonant Tunneling Device", IBM Tech. Discl. Bull., vol. 31, No. 10, Mar. 1989, pp. 150-152.

J. E. Cronin et al., "High Stud-to-Line Contact Area in Damascene Metal Processing" IBM Tech. Discl. Bull. vol. 33, No. 1A, Jun. 1990, pp. 160-161.

J. J. Ritsko et al., "Laser Etching Uniformity and End-Point Detector", IBM Tech. Discl. Bull., vol. 29, No. 4, Sep. 1986, pp. 1799-1801.

METHOD FOR CONTROLLING SILICON ETCH DEPTH

FIELD OF THE INVENTION

This invention relates generally to the field of semiconductor devices. In particular, this invention relates to a semiconductor process in which the depth of semiconductor etch is precisely controlled. More particularly, this invention relates to the use of semiconductor interlayers as etch markers to determine the etch depth in silicon.

BACKGROUND OF THE INVENTION

The manufacture of semiconductor devices generally requires the deposition of a layer which is later etched off to reveal an underlying layer. For example, a conductor will be completely covered with an insulator at one stage in the processing, and at a later stage in the processing, individual segments of the insulator layer will be etched off to reveal the underlying conductor. These deposition and etching steps are used on a variety of conductors, semiconductors, and insulator layers. These processes are important because they provide access to some parts of the semiconductor structure while insulating other parts to control electrical behavior. In order to provide access to an underlying part of a semiconductor structure through an upper layer of the semiconductor structure, the upper layer must be etched completely through. The problem with this is that etching is a difficult process to control accurately and stop on a lower layer without etching into the lower layer. This is an especially critical problem when the underlying layer is very thin with respect to the upper layer. Moreover, the thickness of the upper layer is not generally uniform, and therefore, in order to etch completely through the thick and thin parts of the upper layer the etch process generally etches parts of the underlying layer where the upper layer is thin.

The etching of the lower layer is a problem because it can be very detrimental to the electrical operation of the semiconductor structure to etch into the lower layer. A very common example of this problem is when the emitter is formed in an NPN bipolar transistor. Typically, a bipolar transistor has a base layer covered by an insulator layer and the insulator layer has a very small opening which makes possible the formation of the emitter contact. A layer of N-type polysilicon is deposited over the opening in the insulator layer to contact the base region and form the emitter contact to the bipolar transistor. The bipolar transistor will not be operational if either the emitter contact is not made or the emitter contact is formed through the base layer and into the underlying N-type layer. The emitter may contact the N-type layer underlying the base layer if the etching process which opens the insulator layer etches through the base layer. Etching through the base layer is possible because the thickness of the base layer is very thin. The base layer thickness is typically on the order of 0.1 microns or less. The problems associated with controlling the depth of the etching process are compounded by the fact that many etching processes etch insulators at the same rate as they etch other materials. Moreover, many semiconductor processes distinguish the upper and lower layers merely by the doping type. As a result, the etching process must not only selectively etch layers but it must select differently doped layers which are the same material type. Further, the physical dimensions of the layers being etched continues to become smaller. Therefore, the etching problem continues to become more critical while the physical tools have not substantially changed.

The prior art has used a variety of techniques to solve the etching problem. One technique interposes an etch stop layer between the upper layer and the lower layer. The etch stop layer has an etch rate which is very low compared to the upper layer. The upper layer can be etched completely through while stopping on the etch stop layer and not etching the lower layer. The basic problem with this technique is that the etch stop layer must still be etched to make contact with the lower layer. The same issues of controlling the etch rate of the etch stop layer arise so that the thin lower layer is not etched wile removing the etch stop layer. Moreover, insulating etch stop layers typically prevent the formation of self-aligned transistor structures. Another common technique is the use of an etching chemical (gas or liquid) which is selective to the upper layer but does not etch, or at least etches slower, the lower layer. This is a similar idea to the etch stop layer except that the chemical is selective to the structure rather than modifying the structure to accommodate the chemical. The problem with this technique is that semiconductor devices typically have several layers which are made of the same material but just doped differently and the etch process must discriminate between doped layers. The etching chemical does not generally have a different etch rate for differently doped layers. When the etching chemical does etch doped layers differently, the difference is not large enough to control the process for very thin lower layers. Finally, the prior art has used a variety of optical endpoint detect schemes, such as interferometers, to determine the thickness of material which has been etched. The problem with this technique is that etch rates are not uniform which makes selective etching of thin layers difficult.

OBJECTS OF THE INVENTION

It is an object of the present invention to manufacture a semiconductor device having contacts to thin material layers.

It is a further object of the present invention to selectively etch semiconductor device structures having several layers.

It is still another object of the present invention to selectively etch layers in a semiconductor device structure without etching adjacent layers.

It is still a further object of the present invention to manufacture a semiconductor device having a contact to a thin layer without substantially etching into the thin layer.

It is still another object of the present invention to manufacture a semiconductor device having a contact to a thin layer without substantially etching into the thin layer and without substantially degrading the electrical behavior of the contact.

SUMMARY OF THE INVENTION

The present invention is a structure and method for controlling the depth of an etching process. This invention accomplishes the above objectives because it creates a marker layer which resides between a layer to be etched and a protected layer. The marker layer is detected during the etch process and the etch process is controlled based on the detection of the marker layer.

The marker layer has physical characteristics which are very similar to the layers being etched or protected. The marker layer has a similar lattice constant and electrical behavior to either the etched layer or the protected layer. The marker layer has very different optical properties from the etched or protected layers so that even a thin marker layer can be easily detected using in-situ ellipsometric measurements. A specific embodiment of the present invention is a layer of SiGe interposed between a thick silicon layer and a thin silicon layer. In particular, the SiGe layer has a composition of approximately 10% of germanium and has a thickness of approximately 10Å. The thick silicon layer has a thickness of approximately 5,000Å and the thin silicon layer has a thickness of approximately 1,000Å. A method of etching the thick silicon layer, incorporating one embodiment of the present invention, is to perform a RIE process on the thick silicon layer while monitoring the RIE process with an ellipsometer. When the RIE process encounters the underlying marker layer, the ellipsometer measurements show a marked change. The marked change in the ellipsometer measurements indicate when to stop the RIE process. When the marker layer is very thin, such as 10Å, the RIE process is stopped immediately and the underlying thin silicon layer is not etched into. Even though the RIE process is not uniform, and parts of the marker layer will remain on the surface of the protected layer, this will not affect the electrical behavior of the resulting semiconductor device using this process. This is because the thin SiGe marker layer has physical and electrical characteristics which are very similar to the underlying silicon layer.

DESCRIPTION OF THE PREFERRED EMBODIMENT

Figure 1:
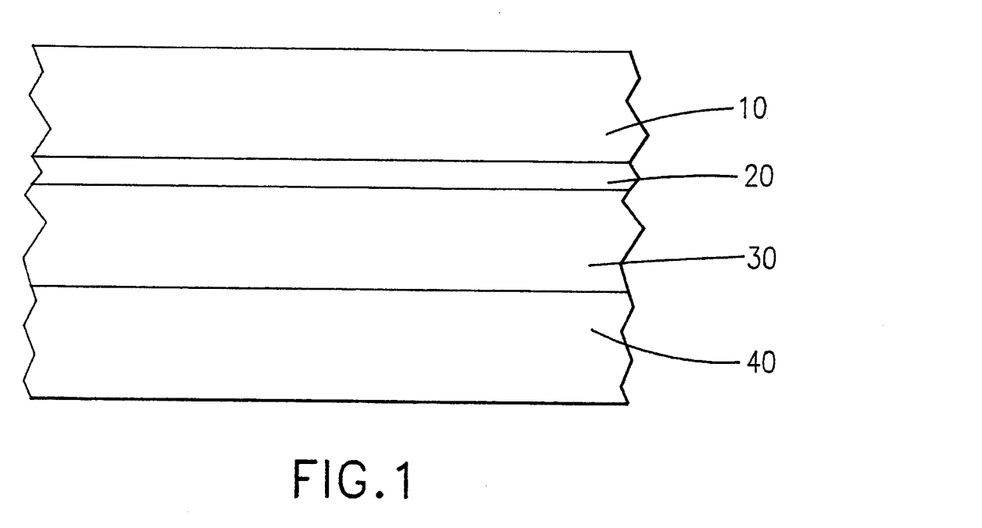
FIG. 1 illustrates a structure according to the present invention.
Figure 2:
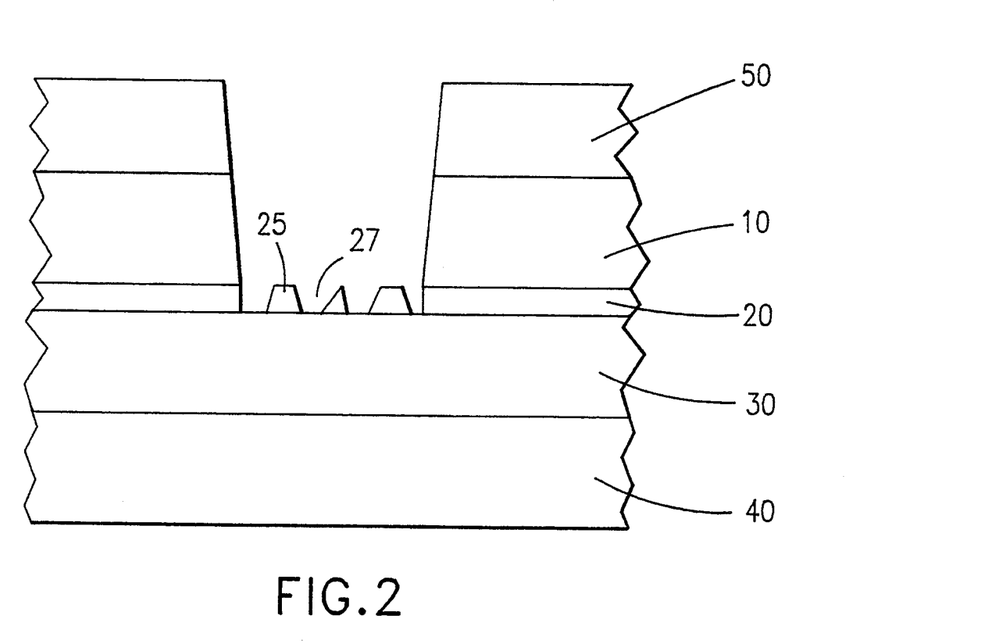
FIG. 2 illustrates a structure formed with a method according to the present invention.

FIG. 1 illustrates an embodiment of the present invention. FIG. 1 illustrates a silicon-germanium (SiGe) layer 20 interposed between an upper silicon layer 10 and a lower silicon layer 30. The SiGe layer 20 has a thickness of approximately 15 Angstroms (Å) or less, preferably approximately 5-10Å. The Germanium content of the SiGe layer 20 is approximately 10% and ranges from approximately 20% to approximately 0.3%. The SiGe layer 20 is used as an etch marker between the two silicon layers 10 and 30. The SiGe layer 20 is not an etch stop layer in which the etch rate of the SiGe is significantly different than the silicon layers. Rather, SiGe layer 20 is a layer which can be easily detected when the etching process etches through the upper silicon layer 10 and starts etching the SiGe layer 20. FIG. 2 illustrates that once the etching process reaches the SiGe layer, the etching process is stopped. The non-uniformity of the etching process will have completely etched through the SiGe layer 20 in some areas 27 and left parts of the SiGe layer 20 in other areas 25. The remaining SiGe left in the area opened by the etch process does not degrade the electrical performance of an electrical contact, which is added by subsequent processing, to the lower layer 30. There is no degredation in the electrical performance in the contact because the SiGe layer is sufficiently thin enough and contains a small enough concentration of germanium to electrically function in a very similar manner to the underlying silicon layer 30.

The structure of FIG. 1 can be fabricated using a number of conventional semiconductor fabrication techniques. The particular method used to fabricate this embodiment included the use of an Ultra High Vacuum/Chemical Vapor Deposition technique for depositing silicon. A single crystal substrate 40 is pre-cleaned with a 1% hydrofluoric (HF) acid solution for 30 seconds. The substrate is then inserted into a vacuum chamber which has been previously evacuated to a pressure of $10^{-8}$ Torr and heated to a temperature of approximately 550° Celsius. The partial pressure of the contaminants in the chamber is maintained below $10^{-7}$ Torr. A silane gas stream is introduced into the chamber and the interaction of the silane with the substrate forms the silicon layer 30 on the substrate 40. After an initial thickness of silicon is applied, a germane gas is introduced into the silane gas stream. The combination of silane and germane interact with the silicon layer 30 to produce the SiGe layer 20. The flow rate of the germane gas as compared to the silane gas maintains the concentration of germanium in the resulting SiGe film at approximately 10% or in the range of below approximately 20% and above approximately 0.3%. When approximately less than 15Å, preferably 5-10Å, of SiGe has been deposited, the germane gas flow is stopped and the silane gas flow continues. This results in the silicon layer 10 covering the SiGe layer 20 and the structure illustrated in FIG. 1 has been formed.

FIG. 2 illustrates an etching process according to the present invention. In particular, the silicon film 10 is selectively etched while the silicon film 30 is not etched and the SiGe film 20 is partially or completely etched.

The etch process is a conventional Reactive Ion Etch (RIE) process in which a reactor contains a cooled, quartz covered, RF powered electrode. An RF power source supplies a 13.56 MHz signal, generating between approximately 10 and 400 Watts of power, to the electrode. The reactor has a pressure of approximately 25 milliTorr. $CF_4$ gas is fed into the reactor having a flow rate of 100 sccm. The substrate 40 is patterned with photoresist using conventional techniques. Photoresist remains on the substrate in areas where no etching is to occur, and photoresist is removed from areas where etching is to occur. The substrate is placed on the electrode and the etch process is started. The power level supplied to the electrode controls the etch rate of the RIE process. Initially the power level is high, greater than approximately 100 W, to provide a high etch rate which etches the upper layer quickly. As the depth through the upper layer gets closer to the SiGe layer the power is reduced, to approximately 25 W, to slow down the etch rate. The slower etch process is allowed to continue until the SiGe layer is detected at which time the etch process is continued for a time sufficient to etch the SiGe layer but not etch the underlying silicon layer 30. The length of time that the RIE process is left on to etch the SiGe layer depends on the etch rate of the particular SiGe layer being etched and its thickness. For example, a SiGe layer having 10% Ge and being approximately 15Å in thickness being etched at 25 W would take approximately 30 seconds to etch. This time is generally an approximation which is made to remove a part of the SiGe layer 20 but not etch the underlying silicon layer 30. This partial etch of the SiGe layer leaves part 25 of the SiGe layer 20 in the RIE etch area.

The SiGe layer 20 is detected in the etching process by the use of in-situ ellipsometry. Ellipsometry is the measurement of the effect of reflection on the state of polarization of polarized light. The state of polarization is characterized by the phase and amplitude relationships between the two component plane waves of the electric field vector into which the polarized oscillation may be resolved. One plane wave, designated p, is in the plane of incidence. The other plane wave, designated s, is normal to the plane of incidence. In general, reflection of incident light causes a change in the relative phases of the p and s plane waves and a change in the ratio of their amplitudes. The angle $\Delta$ is defined as the change in phase between the two waves. The angle $\Psi$ is defined as the arctangent of the factor by which the amplitude ratio changes. More particularly, if phase angles are designated B and amplitudes are designate A, then $\Delta=(B_p-B_s)_{reflected}-(B_p-B_s)_{incident}$. Also, $\Psi=\arctan[(A_p/A_s)_{reflected}/(A_p/A_s)_{incident}]$.

Figure 3:
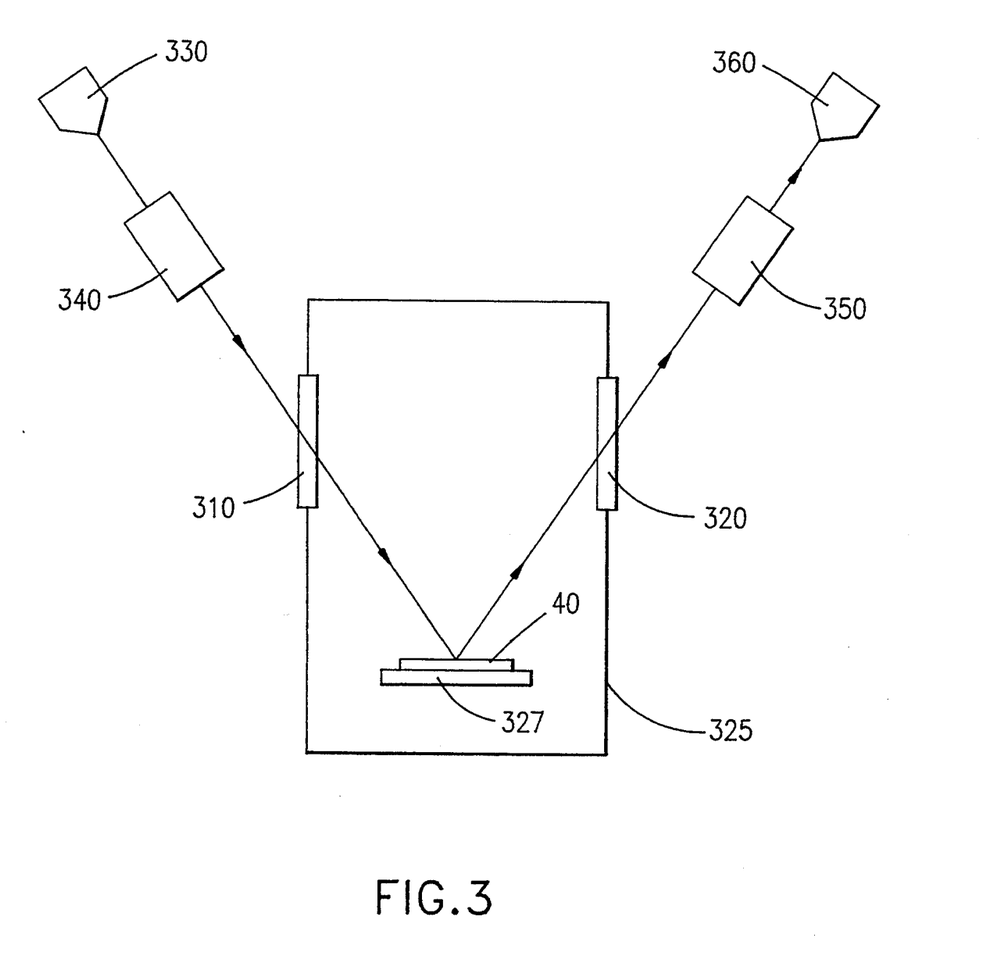
FIG. 3 illustrates the relationship between the ellipsometer and the reaction chamber used in the present invention.

The ellipsometer measures $\Psi$ and $\Delta$. $\Psi$ and $\Delta$ change as a function of the index of refraction, $\eta$, of a material. As $\eta$ changes, the reflected light changes and $\Psi$ and $\Delta$ are an accurate measurement of that change. In particular, ellipsometer measurements are accurate enough to detect a change from $\eta=3.88$ (silicon) to $\eta=3.882$ (silicon with a very small amount of an added compound such as Ge). The ellipsometer apparatus comprises a laser light source, a polarizer, an analyzer, and a detector. FIG. 3 illustrates the relationship between the various components of the ellipsometer, the reactor chamber, and the substrate having a semiconductor structure on which ellipsometer measurements are taken. The substrate, removably attached to electrode 327, must remain within the reactor chamber 325 in which the RIE process takes place. The reactor chamber 325 has windows 310 and 320 through which laser light from the ellipsometer passes. The laser light source 330 generates a light wave having a very narrow frequency range, here a wavelength of 632.8 nanometers, which is polarized by polarizer 340. The polarized light passes through window 310 and strikes the substrate surface being etched. The polarized light has a angle of incidence with respect to the substrate of approximately 75°. The polarized light is reflected off the substrate surface through window 320 and into analyzer 350 (which includes a rotating compensator). Analyzer 350 polarizes the reflected light and the polarized reflected light is received by the detector 360. The detector 360 measures $\Psi$ and $\Delta$. The detector must be calibrated on each etch system before the start of the measurements because the laser light passes through windows 310 and 320 which distort the laser light and the calibration must take this distortion into account.

Figure 4:
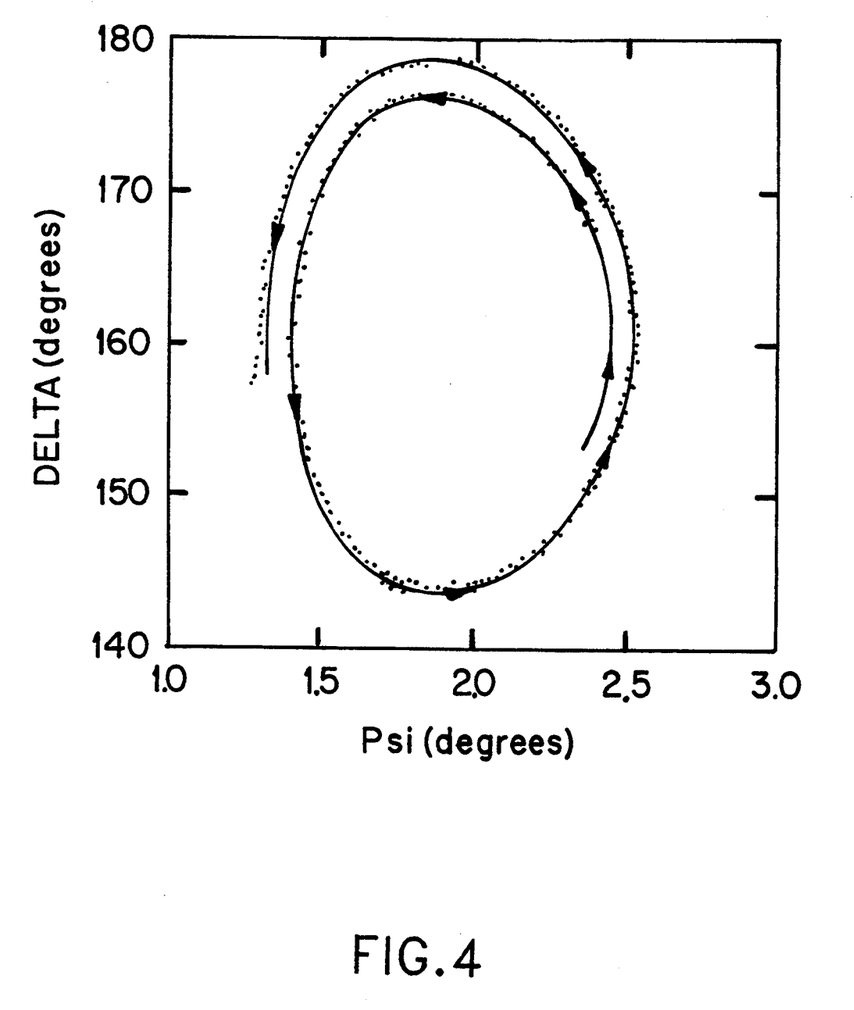
FIG. 4 illustrates the relationship between $\Psi$ and $\Delta$ as measured with the ellipsometer used in the present invention.
Figure 5:
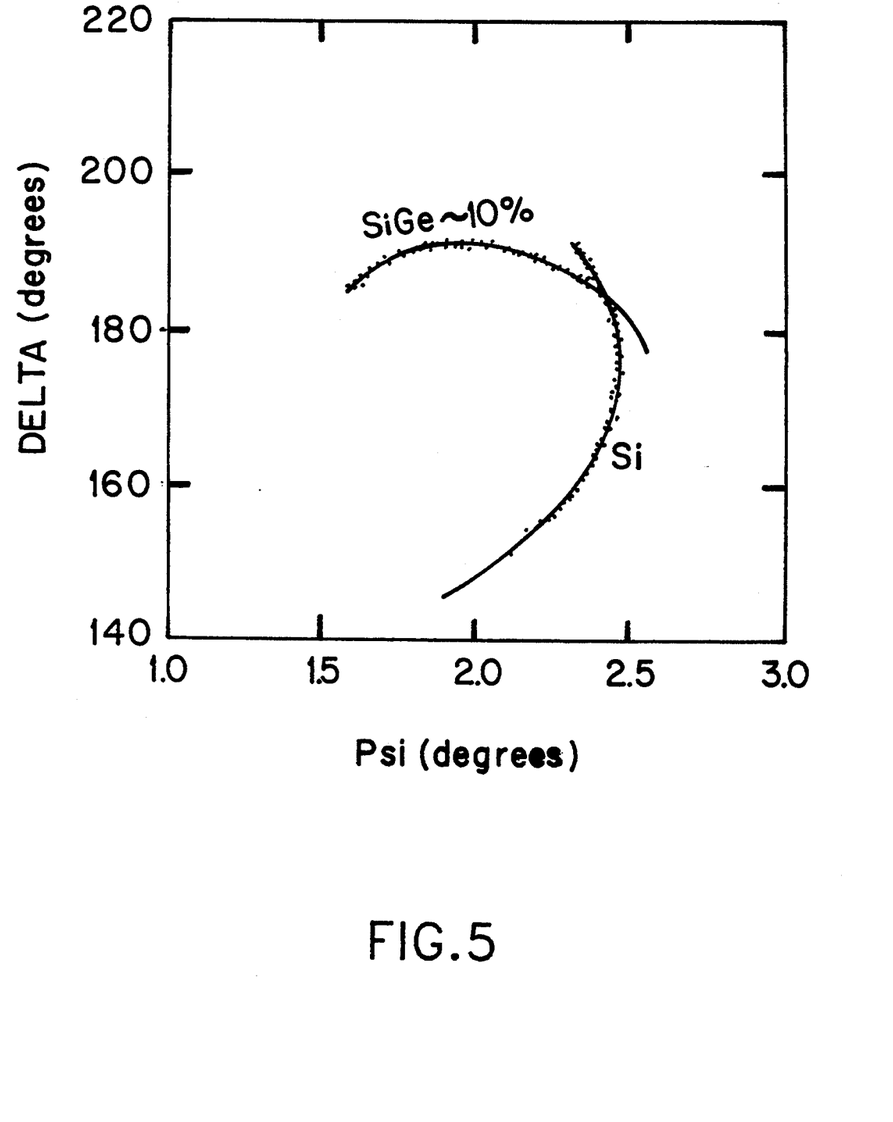
FIG. 5 illustrates the relationship between $\Psi$ and $\Delta$ as measured with the ellipsometer used in the present invention on a composite film having a silicon layer and a SiGe layer.

FIG. 4 illustrates a plot of $\Psi$ and $\Delta$ for a typical measurement of a uniform film. The individual points represent the measured data and the solid line represents a computer simulation of the data. The arrowheads indicate the direction of the data for a decreasing thickness of the film being etched. That is, the more a film is etched, the farther along the plot in the direction of the arrowheads the measurement proceeds. FIG. 5 illustrates the in-situ ellipsometer measurement of a silicon layer with an underlying SiGe layer. The germanium content of the SiGe layer is approximately 10%. FIG. 5 illustrates that as the silicon layer thickness decreases, a sharp departure from the curvature of the silicon data is encountered. This sharp departure illustrates the reaction of the reflected laser light to the underlying SiGe layer. The ellipsometer has detected the etching of the SiGe layer. The ellipsometer has the ability to detect a SiGe layer having a Ge content as low as 0.3% and having a thickness of approximately 7Å or more.

The fact that the ellipsometer technique can detect a thin layer of SiGe interposed between layers of silicon is important because SiGe electrically behaves like silicon when the SiGe layer is thin enough and contains a small enough percentage of germanium. As a result, the vertical structure of a silicon layer can be divided into several layers with each silicon layer being marked off by a thin SiGe layer. Electrical contact to each layer can be made without etching through the thin layer to be contacted because the etching process can be stopped on detection of a SiGe layer having a thickness as small as 7Å. Moreover, even though the etching process did not remove all of the SiGe layer from an etched area, the remaining SiGe has a lattice constant and electrical behavior near silicon when the SiGe layer is thinner than approximately 20Å. Therefore, the remaining SiGe does not electrically interfere with the semiconductor device fabricated with the structure and process of the present invention. Moreover, the thickness of the marker layers is generally in the range of less than approximately 50Å because these thicker marker layers are still compatible with the electrical performance of the device. The preferred marker layer thickness is less than approximately 20Å.

Figure 6:
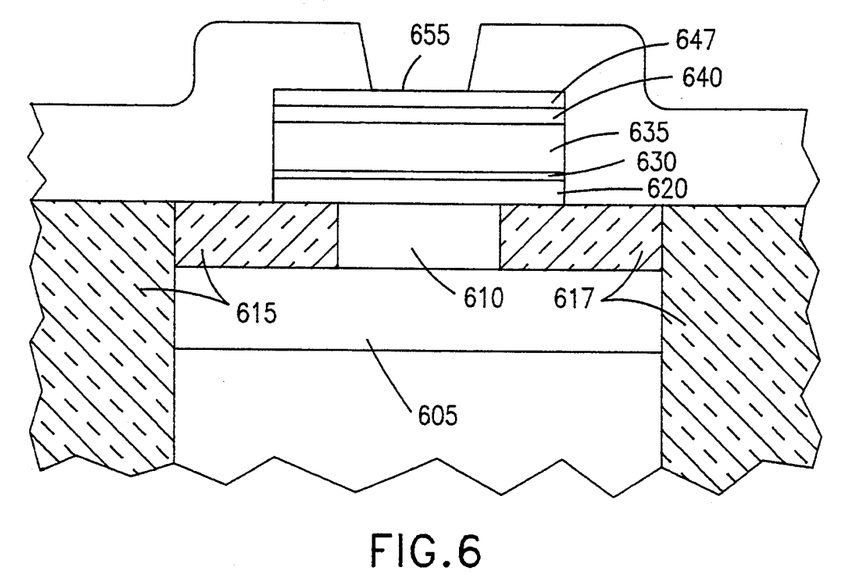
FIG. 6 illustrates a semiconductor device structure formed according to the present invention before a RIE process step.
Figure 7:
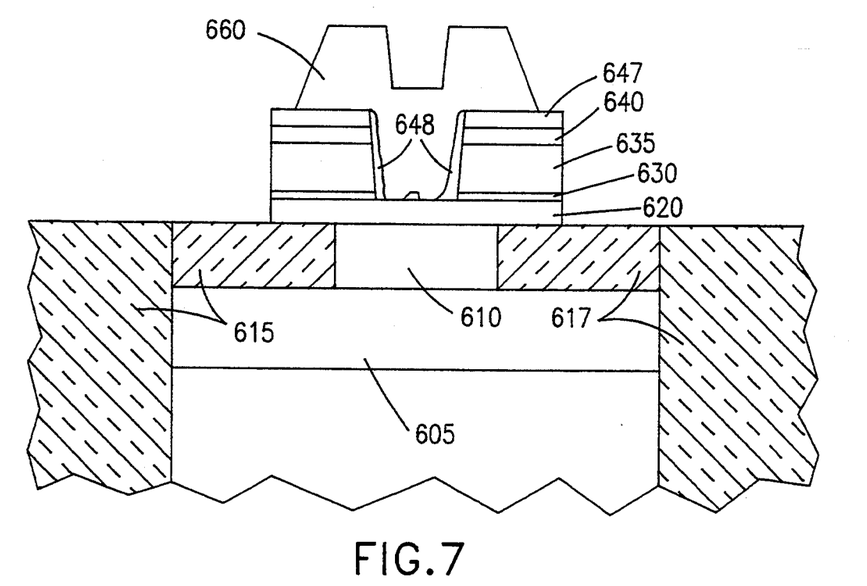
FIG. 7 illustrates a semiconductor device structure formed according to the present invention after a RIE process step.

FIGS. 6 and 7 illustrate the use of the SiGe layer in a semiconductor device. FIG. 6 illustrates a cross section of a bipolar device at an intermediate stage in the processing (the reach-thru diffusion to the subcollector 605 is not shown). An isolated epitaxial region 610, doped N-type, is in contact with an N+ doped subcollector 605. The isolation regions 615 and 617 are filled with silicon dioxide. A lightly doped P-type silicon layer 620 having a concentration of approximately $2\times10^{18}$/cm$^3$ and a thickness of approximately 1,000Å is deposited by the UHV/CVD technique over the N-type epitaxial region 610. A SiGe layer 630 having a thickness of approximately 10Å is deposited over layer 620. The SiGe layer 630 is covered by a P+ polysilicon layer 635 which is in turn covered by a silicon dioxide layer 640 and silicon nitride layer 647 respectively. The P+ layer 635 has a dopant concentration of approximately $10^{20}$/cm$^3$ and a thickness of approximately 2,000Å. The thickness of layers 640 and 647 is approximately 1,200Å. Photoresist is applied to the nitride surface layer 647 and developed in a conventional photolithography step to form the emitter contact area 655. A selective RIE process is then performed which etches through the nitride and oxide layers and stops on the underlying silicon layer 635. Another RIE process which etches silicon is then performed. This silicon RIE process etches into and through the polysilicon layer 635 while being monitored by the ellipsometer. The RIE process continues until the ellipsometer indicates that the SiGe layer 630 is being etched. The silicon RIE process is then stopped after some overetch to remove part of the SiGe layer. The silicon etching process does not etch into the underlying lightly doped region 620. The lightly doped region 620 has a thickness of less than approximately 1,000Å. Once the polysilicon 635 and SiGe 630 layers have been etched, the photoresist is stripped off and an oxide sidewall (648) is formed. A layer of heavily doped N+ polysilicon is then applied. FIG. 7 illustrates the formation of the N+ polysilicon layer 660 which forms the emitter contact of the bipolar device. The device has a small basewidth formed by layer 620 because the RIE process could be controlled without etching through layer 620. Moreover, any remaining germanium in the emitter opening does not affect the operation of the emitter-base diode of the semiconductor structure.

Figure 8:
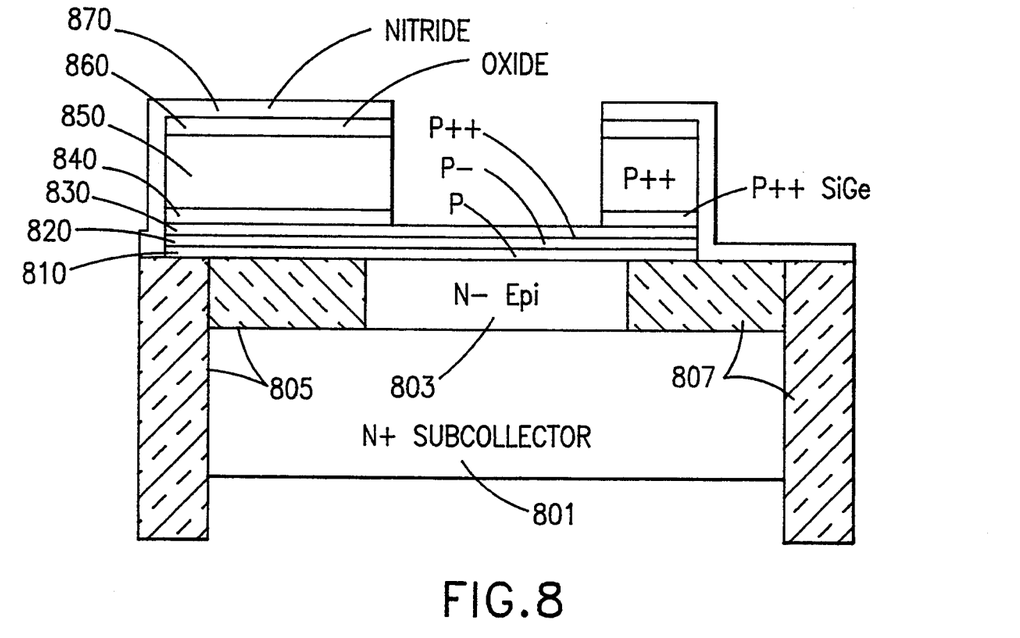
FIG. 8 illustrates an alternate semiconductor device structure formed according to the present invention at an intermediate process step after a RIE processing step.

FIGS. 8, 9, 10, and 11 illustrate a further embodiment of the present invention. FIG. 8 illustrates a cross section of a semiconductor device at an intermediate stage in processing. An N-type epitaxial silicon layer 803 is deposited on an N+ subcollector 801. The epitaxial region 803 and the subcollector 801 are isolated by regions 805 and 807. A sequence of layers are then formed by UHV/CVD over the epitaxial region 803 and isolation regions. The first layer is a P-type silicon base region 810, doped to $10^{19}$/cm$^3$ and having a thickness of approximately 150Å. Layer 810 is covered by layer 820 which is a P-type silicon cap layer, having a doping concentration of approximately $10^{18}$/cm$^3$ and having a thickness of approximately 300Å. Layer 820 is covered by layer 830 which is a heavily doped P-type silicon layer, doped to $3\times10^{21}$/cm$^3$ and having a thickness of approximately 100Å. Layer 830 forms a part of the extrinsic base region of the bipolar device. Layer 830 is covered by a layer of SiGe 840 which has a germanium content of approximately 20%, is doped P-type to approximately $5\times10^{21}$/cm$^3$, and has a thickness of approximately 10Å. The SiGe layer 840 is covered by a P-type silicon layer 850 which is also doped to approximately $5\times10^{21}$/cm$^3$ and has a thickness of approximately 1,000Å. Layer 850 is doped to a high concentration to take advantage of enhanced selective oxidation at low temperature (approximately 600&Deg. Celsius). The layer 850 is covered by a layer of silicon dioxide 860 having a thickness of approximately 1,000Å which is in turn covered by a layer of silicon nitride 870 having a thickness of approximately 1,000Å. The silicon nitride layer 870 has been patterned by a first photolithography step to define a contact region. A RIE process having an initial power level of approximately 100 W is performed on the exposed stack of layers. The RIE process etches the stack down to and through the oxide layer 860 and into the P+ layer 850. The power of the RIE process is decreased to approximately 25–50 W as the etch process gets closer to the SiGe layer. The RIE process is monitored by in-situ ellipsometry to determine when the SiGe layer has been etched into. The RIE process is continued for approximately 30 seconds after the SiGe layer is detected to etch the 10Å of SiGe. The RIE process is then stopped when the SiGe layer is etched through to the underlying silicon layer 830.

Figure 9:
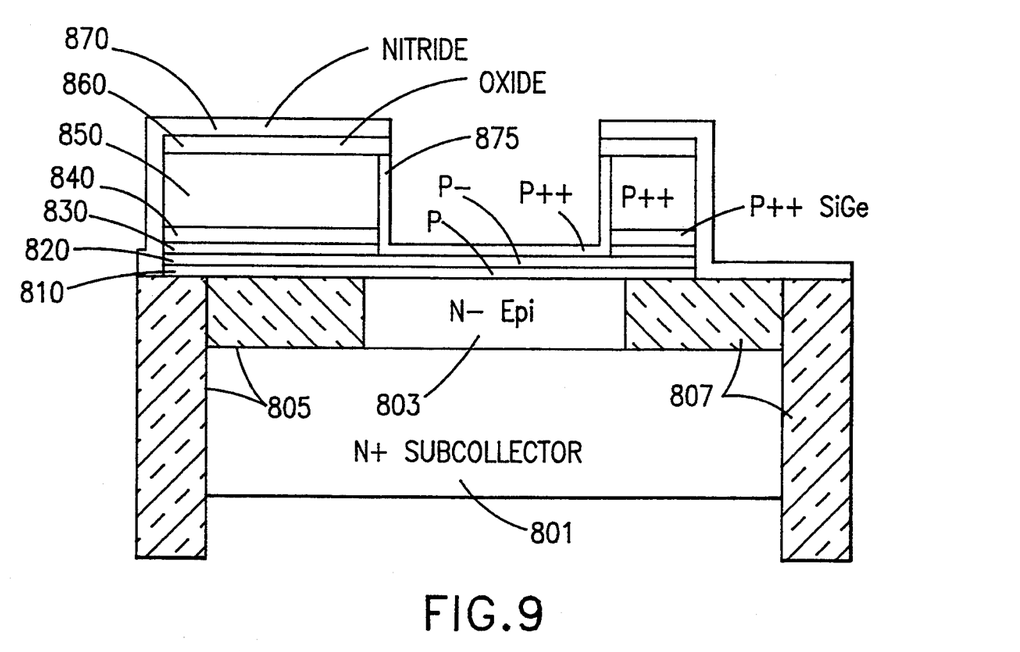
FIG. 9 illustrates an alternate semiconductor device structure formed according to the present invention at an intermediate process step after the formation of a silicon dioxide layer formed in a high pressure oxidation step.
Figure 10:
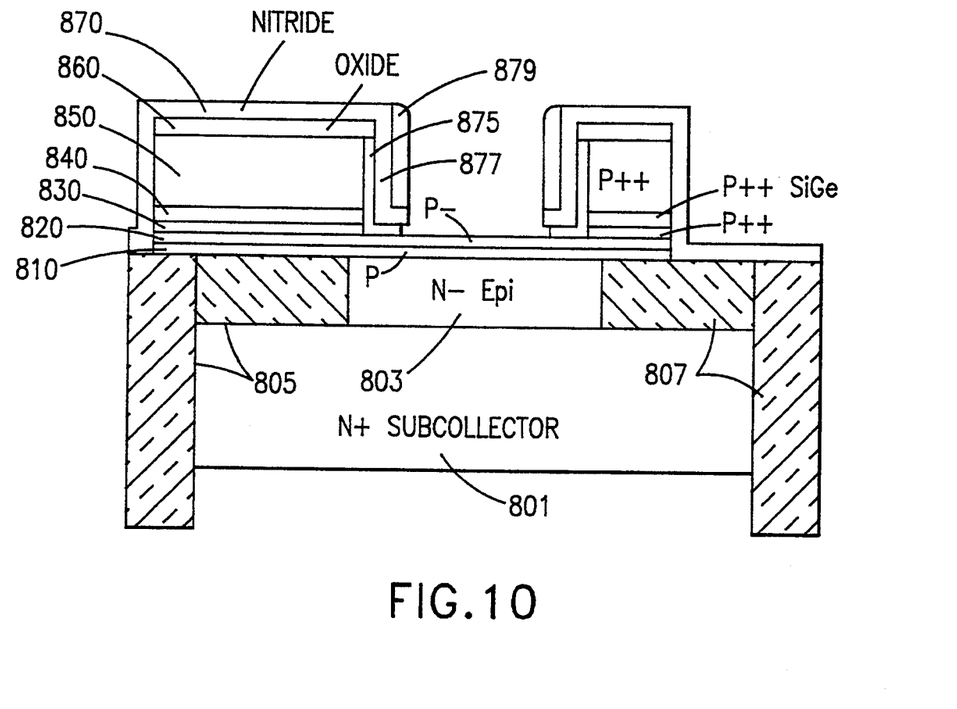
FIG. 10 illustrates an alternate semiconductor device structure formed according to the present invention at an intermediate process step after the formation of a sidewall insulators.
Figure 11:
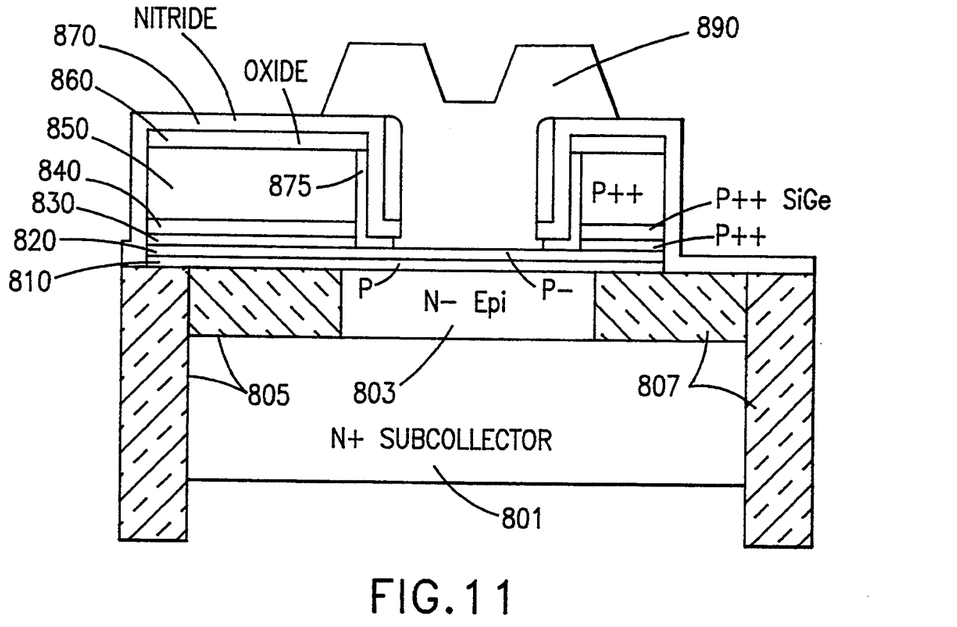
FIG. 11 illustrates an alternate semiconductor device structure formed according to the present invention at an intermediate process step after the formation of the emitter contact.

FIG. 9 illustrates that once the heavily doped P-type region 830 is exposed, it is oxidized in a conventional high pressure oxidation process performed at approximately 600° C. and approximately 10 Atm. H$_2$O, in which heavily doped regions oxidize much faster than lightly doped regions. The exposed part of layer 830 is completely oxidized. The high pressure oxidation process produces layer 875 which is approximately 200Å thick and covers parts of layers 840 and 850 as well as 830. It is important that the RIE process not etch through layer 830 so that layer 820 is not oxidized. FIG. 10 illustrates that layer 875 is covered by a silicon nitride layer 877 having a thickness of approximately 1,200Å. Layer 877 has sidewall silicon dioxide layer 879 deposited on the surface of nitride layer 877. The thickness of layer 879 is approximately 1,200Å. A blanket RIE process is then performed to remove the horizontal surface layers of silicon dioxide layer 879 and leave verticle layers of silicon dioxide layer 879 on the contact sidewall. The blanket etch etches into and stops in the underlying oxide layer 875. The blanket etch will strip layers 877 and 879 from nitride layer 870 outside of the contact regions. The remaining oxide of layer 875 is then dip etched out in a conventional buffered hydrofluoric (BHF) acid solution which etches silicon dioxide but does not etch silicon. The BHF step opens up the base region for the emitter contact. FIG. 11 illustrates that polysilicon 890 is then deposited in the contact region to form the emitter of the bipolar transistor. The deposition of the polysilicon and formation of the emitter contact are performed using conventional vapor deposition, doping, and photolithographic techniques which are well known in the art.

The method and structure of using marker layers in combination with the in-situ ellipsometry measurement to control an etching process is not limited to silicon layers and SiGe marker layers. For example, pure silicon layers can be interposed between Ge layers, or pure Ge layers can be interposed between silicon layers. Additionally, a silicon marker layer can be used between two GaAs layers or other III–V or II–VI compound. These combinations of materials all have very different optical properties but very similar electrical properties. The similar electrical behavior enables electrical device structures to be built without electrical degradation due to contact surfaces not being completely etched. Additionally, the different optical properties allows the optical detection scheme of ellipsometry to precisely detect the end of the etching process even for very thin layers. Further, marker layers can also be used between insulator layers because of the different optical properties between the marker layers and the insulator layers such as $SiO_2$ or $Si_3N_4$.

While the invention has been described and illustrated with respect to plural embodiments thereof, it will be understood by those skilled in the art that various changes in the detail may be made therein without departing from the spirit, scope, and teaching of the invention. Therefore, the invention disclosed herein is to be limited only as specified in the following claims.

Having thus described our invention what we claim as new and desire to secure as Letters Patent, is:

1. In a method for making an electronic device, a method for etching an aperture through a first layer and stopping at an adjacent second layer, without any significant etching of said second layer, when said first and second layers have similar etching properties and the indexes of refraction of said first and second layers are too close to each other to be readily distinguishable optically, comprising the steps of:

interposing a marker layer between said first layer and said second layer, said marker layer having a sufficiently small thickness and a composition sufficiently close to either said first or said second layer that the electrical behavior of said electronic device is not substantially affected by said interposed marker layer, said first layer having a first index of refraction and said marker layer having a second index of refraction different from said first index of refraction by an amount sufficient to be optically detectable;

etching an aperture through said first layer;

optically monitoring said etching step during said etching step to detect when said etching step etches into said underlying marker layer; and terminating said etching step after said monitoring step detects that said marker layer has been etched into;

whereby said aperture is etched through said first layer and said second layer has not been significantly etched.

2. A method for making an electronic device, as in claim 1, wherein:

said marker layer has a thickness of less than approximately 50Å.

3. A method for making an electronic device, as in claim 2, wherein:

said first and second indexes of refraction differ by at least 0.002, and said monitoring step detects a change in index of refraction between said first layer and said marker layer to determine when said etching step etches into said underlying marker layer.

4. A method for making an electronic device, as in claim 3, wherein:

said marker layer is composed of $Si_xGe_{1-x}$ wherein $0 \leq x \leq 1$.

5. A method for making an electronic device, as in claim 4, wherein:

said first layer is composed of $Si_xGe_{1-x}$ wherein $0 \leq x \leq 1$.

6. A method as defined in claim 1 wherein said optically monitoring step detects that said marker layer has been etched into through use of ellipsometry.

7. A method as defined in claim 6 wherein said first and second indexes of refraction differ by an amount about 0.002.

8. A method as defined in claim 1 wherein said etching step is terminated as soon as said monitoring step detects that said etching step has etched into said marker layer.

9. A method as defined in claim 1 wherein said etching step is terminated after a delay following detection by said monitoring step that said etching step has etched into said marker layer.

10. A method as defined in claim 1 wherein said first and second layers are substantially identical in composition.

11. A method as defined in claim 1 wherein said first and second layers are both made of silicon.

12. A method as defined in claim 11 wherein said first and second layers of silicon are not both doped.

13. A method as defined in claim 11 wherein said first and second layers of silicon are doped differently.

14. A method as defined in claim 11 wherein said marker layer is made of SiGe with the proportion of germanium being between approximately 0.3 atomic percent and approximately 20 atomic percent.

15. A method as defined in claim 14 wherein said proportion of germanium is approximately 10 atomic percent.

16. A method as defined in claim 1 wherein said second layer has a thickness between approximately 100 angstroms and approximately 1000 angstroms and said marker layer has a thickness of less than approximately 15 angstroms.

17. A method as defined in claim 16 wherein said marker layer has a thickness of about 5 to 10 angstroms.

18. A method as defined in claim 1 wherein said etching step is terminated before said marker layer has been totally removed in said aperture.

* * * * *